United States Patent [19]

Yamanaka

[11] Patent Number: 4,555,756

[45] Date of Patent: Nov. 26, 1985

[54] PLANT CONTROLLER SIMULATOR WITH STRUCTURE FOR COMBINING SIMUATION SIGNALS WITH ACTUAL PROCESS I/O SIGNALS

[75] Inventor: Kimio Yamanaka, Hyogo, Japan

[73] Assignee: Mitsubishi Denki Kabushiki Kaisha, Tokyo, Japan

[21] Appl. No.: 440,658

[22] Filed: Nov. 10, 1982

[30] Foreign Application Priority Data

Nov. 12, 1981 [JP] Japan .................................. 56-182530

[51] Int. Cl.$^4$ ............................................. G05B 17/00
[52] U.S. Cl. ...................................... 364/130; 364/578
[58] Field of Search ........ 364/130, 578, 200 MS File, 364/900 MS File; 371/23

[56] References Cited

U.S. PATENT DOCUMENTS

| | | | |
|---|---|---|---|
| 3,969,722 | 7/1976 | Danco et al. ....................... | 364/200 |
| 4,064,394 | 12/1977 | Allen ............................... | 364/200 X |
| 4,099,252 | 7/1978 | Danco et al. ........................ | 364/200 |
| 4,298,958 | 11/1981 | Takaki et al. ...................... | 364/900 |
| 4,342,093 | 7/1982 | Miyoshi .............................. | 364/578 |
| 4,385,349 | 5/1983 | Ashford et al. ................. | 364/578 X |

Primary Examiner—Jerry Smith
Assistant Examiner—Clark A. Jablon
Attorney, Agent, or Firm—Sughrue, Mion, Zinn, Macpeak & Seas

[57] ABSTRACT

A simulator apparatus for simulating a plant controller is connected to a process input/output circuit via a data bus, and via stations connected to the data bus. The actual plant controller is also connected to the same data bus via another of said stations, and can thereby receive signals from either the plant controller or the simulator, indiscriminately. Individual stations include input and output buffer registers and buffer memories, and an output OR circuit may be connected between the input and output registers.

5 Claims, 5 Drawing Figures

PLANT CONTROLLER SIMULATOR WITH STRUCTURE FOR COMBINING SIMUATION SIGNALS WITH ACTUAL PROCESS I/O SIGNALS

BACKGROUND OF THE INVENTION

This invention relates to a simulator which issues signals simulating various plant conditions to control units of various installations. More particularly, this invention relates to a simulator for issuing various types of signals simulating actual steel rolling to a control unit, for example, when the steel material is not actually being supplied, in order to check the controllability of the control unit and train operators.

FIG. 1 shows a typical block diagram of a conventional simulator. For example, a simulator of this type includes a controller 1 for controlling a hot strip mill which provides input signals simulating whether or not a roll material is supplied and how fast it is fed, and the simulator 2 delivers a conditioned process input signal $D_p$ through, for example, relay logic 3 illustrated in FIG. 2, for the controller 1. In this type of simulator, a process input signal Pv is input to the controller 1 for plant control through relay logic 3. In other words, the relay logic 3 in FIG. 2 yields an input signal ei to the controller 1 based on the logical switching of an actual process input signal Pv and the simulating signal $D_p$, by means of a simulating mode signal Ms(FIG. 2) which is applied to an input terminal of the gate circuit 31 and instructs whether or not the simulator is operated. The controller 1 performs necessary operations (for instance, a PID control operation) according to the input signal ei and outputs a control signal Po that can trigger the actual process. This control signal Po is fed back to the input terminal of the simulator 2.

The conventional simulator provides disadvantages in that the larger the plant system, the larger the feed back input to the simulator 2, and in that relay logic is required for the input to each controller 1. This makes the system complicated and requires a large scale amendment upon a change of the simulation logic. When the relay logic is composed of switches, the logic is easily modified, but there is a problem such as a time lag because the input to the controller 1 is made by means of the switches.

SUMMARY OF THE INVENTION

This invention, therefore, contemplates the elimination of the noted disadvantages of the prior art simulators.

One of the features of this invention resides in the interconnection of the controller, the process input/output unit and the simulator with one another by means of stations and a data path, and the provision of signals transmitted to and from these units by means of the stations and the data path.

DETAILED DESCRIPTION OF THE PREFERRED EMBODIMENTS

Figure 3:
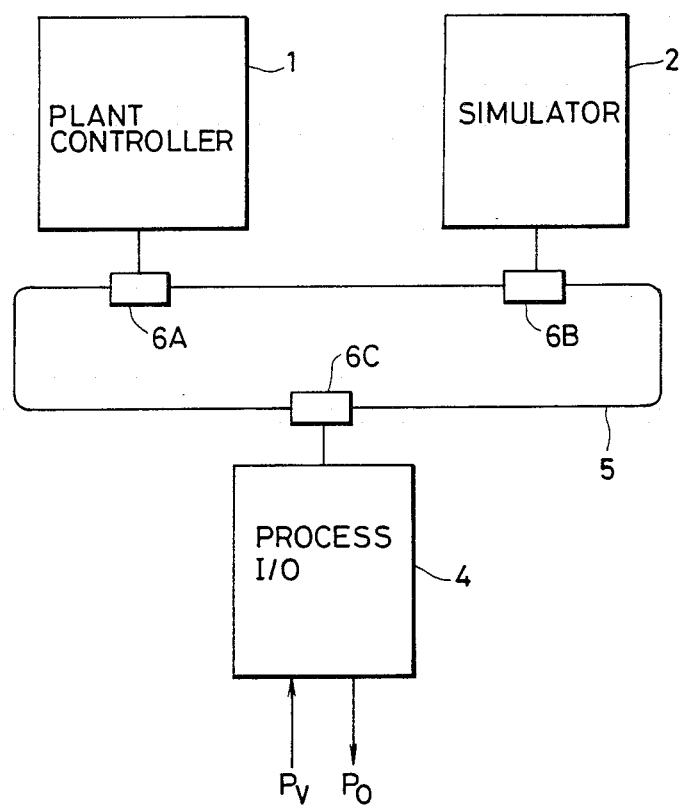
FIG. 3 is a general diagram of the device according to this invention.

FIG. 3 is a general diagram of a device according to this invention. In the FIG., 1 is a plant controller, 2 is a simulator which outputs a simulating signal, 4 is a process input/output device, 5 is a data bus or pathway, and 6A, 6B and 6C are stations inserted in the data bus 5. The plant controller 1, the simulator 2 and the process input/output device 4 are connected to the data path 5 through stations 6A, 6B and 6C. It is possible to use a plant controller such as a programmable controller for the simulator 2. In FIG. 3 only one plant controller and process input/output device are shown, but usually a plural number of these units are used.

Figure 1:
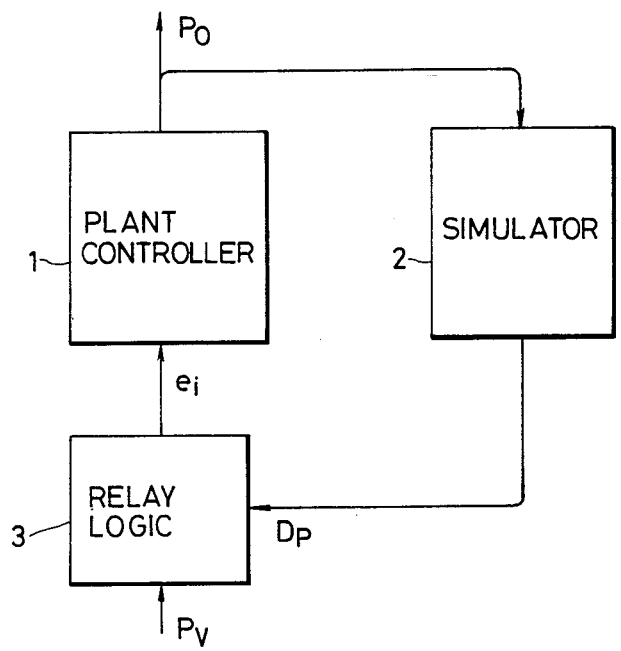
FIG. 1 is a block diagram showing a typical example of a conventional simulator.
Figure 2:
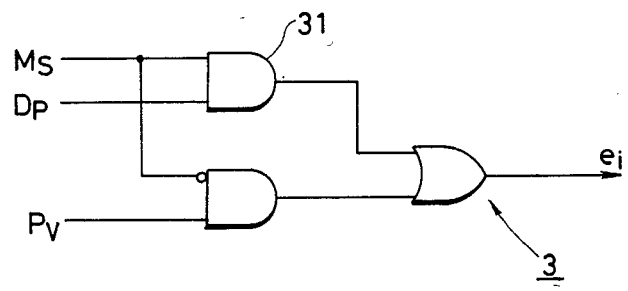
FIG. 2 is a circuit diagram of the relay logic used in the device shown in FIG. 1.

The process input signal Pv input from the process input/output device 4 is input to the plant controller 1 through the station 6C, the data bus 5 and the station 6A, and a control operation is performed in this controller. On the contrary, the control output from the controller is transmitted through the station 6A, the data path 5, the station 6C and the process input/output device 4. In this case, both the input to and the output from the plant controller 1 pass through the station 6B connected to the simulator 2. By giving the station 6B a function equivalent to the relay logic 3 in FIG. 1, the simulator 2 can treat a process input signal Pv and transmit it to the plant controller 1.

Figure 4:
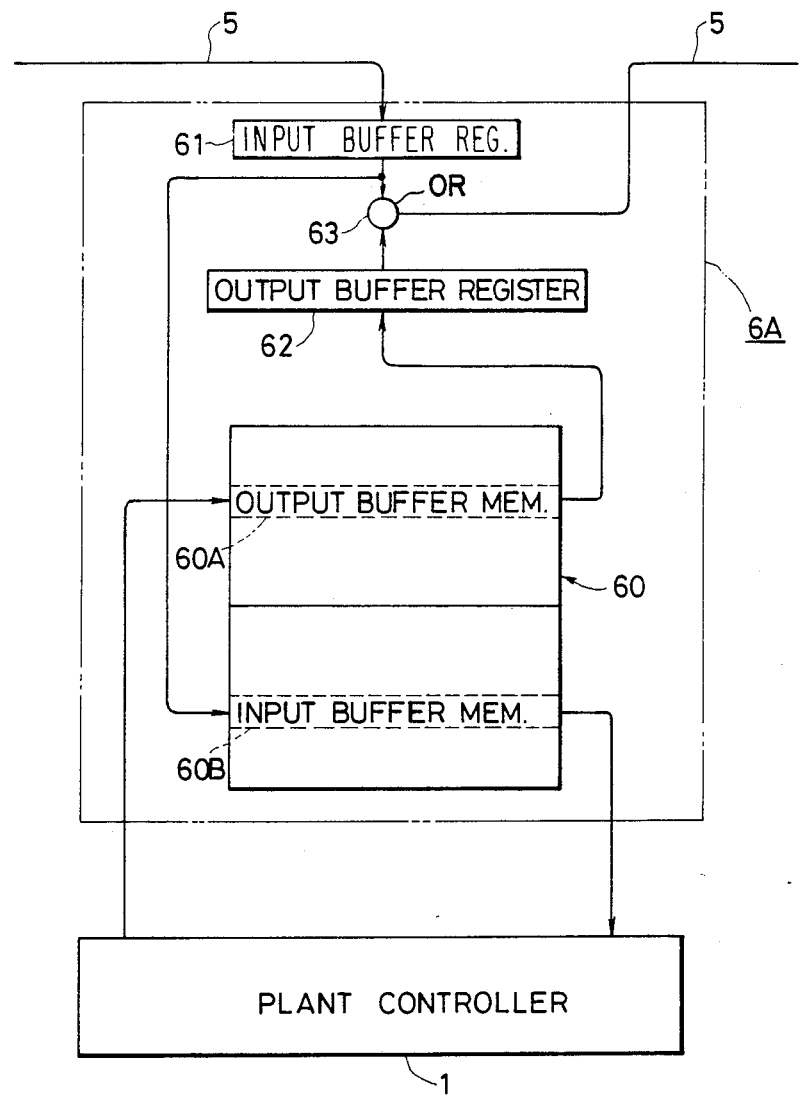
FIG. 4 is a block diagram showing an example of a station shown in FIG. 3.

FIG. 4 is a detailed block diagram showing an example of the station 6A inserted in the data path 5.

The data and the process input signal fed through the data bus 5 are, through the input buffer register 61, written in the input buffer memory 60B which is formed as a part of a memory circuit 60, and output to the plant controller 1. On the other hand, the output from the plant controller 1 is written in the output buffer memory 60A which is formed at a part of the memory circuit 60. The output is applied through the output buffer register 62 to the OR circuit 63 with a desired timing. In the OR circuit 63, the output is logically summed with the data stored in an assigned address of the input buffer register 61, the assigned address corresponding to that of the output buffer register 62. The output of the OR circuit 63 is then transmitted to the succeeding station 6B.

The structure of the station 6B connected to the simulator 2 and that of the station 6C connected to the process input/output device 4 are almost the same as that shown in FIG. 4. In the station 6B, the signal from the simulator 2 is transmitted to the data bus 5 through output buffer memory 60A and input to the plant controller 1, and the output signal from the plant controller 1 is applied to the simulator 2 through the input buffer memory 60B. In station 6C, the process input signal is transmitted to the data bus 5 through the output buffer memory 60A and input to the plant controller 1, and the output signal from the plant controller 1 is output to the I/O device via the input buffer memory 60B.

Figure 5:
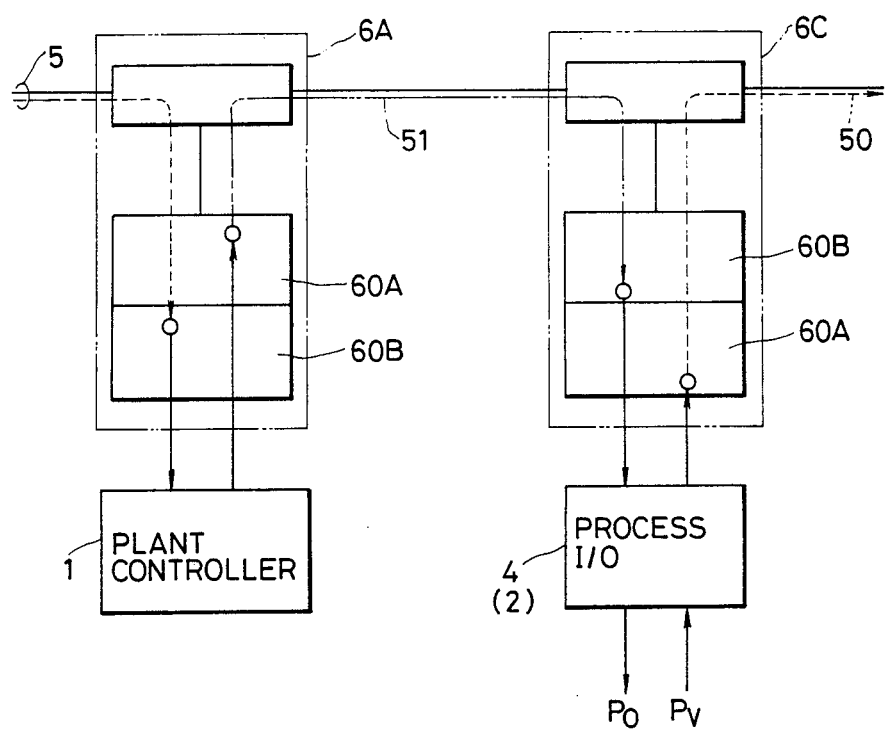
FIG. 5 is an explanatory drawing showing the exchange of signals between the plant controller and the process input/output device.

FIG. 5 is an explanatory drawing showing the exchange of signals between the plant controller 1 and the process input/output device 4. Shown with the broken line 50 in FIG. 5 is the flow of the process input signal and shown with the chain line 51 is the flow of the output control signal from the plant controller 1. In the simulating condition, the simulator 2 takes the place of the device 4.

In a device having such structure, in the ordinary control condition, the process input signal Pv is input to the plant controller 1 through the process input/output device 4, the station 6C and the data bus 5. In the simulating condition, the output from the simulator 2 is logically summed with the process input signal Pv at the station 6B, and the output signal from the simulator 2 can be input to the plant controller through the data bus 5.

In other words, in the case of a hot strip mill control plant, for example, it is possible to indicate the condition of the nonexistence of material in an actual plant (logic "0") and that indicating its existence (logic "1") via the simulator 2. Thus, the plant controller 1 functions as if material exists and a simulation operation thereof is carried out. Since the simulator 2 can produce outputs indicating various plant conditions, simulation of the plant controller 1 under a variety of conditions is possible.

In the above embodiment, the input and output are separated in stations 6 as shown in FIG. 4, but they can exist in one station.

As explained above, when the process input/output signals are passed through the data bus, the signals are exchanged in transit. Therefore, this invention needs no special hardware and enables a high-speed simulator with easy maintenance.

What is claimed is:

1. A simulation system for performing simulation of a plant controller, comprising; an input/output device for interfacing process input/output signals, a data path for transmitting said process input/output signals, at least three stations inserted in the said data path, each including input/output buffer memories, said plant controller being connected to said data path through one of said stations, an output signal from the plant controller being transmitted via the output buffer memory of said one station, the data path and the input buffer memory of another of said stations, and simulator means for supplying a simulating signal to said plant controller through the output buffer memory of a further station coupled to said simulator means, the data path and the input buffer memory of said one station.

2. An apparatus as claimed in claim 1, at least said one station including an input buffer register connected to said data path and to the input buffer memory of said one station.

3. An apparatus as claimed in claim 2, at least said one station further including an output buffer register connected to the output buffer memory of said one station.

4. An apparatus as claimed in claim 3, at least said one station further comprising output OR circuit means connected to said data path, and receiving the outputs of said input and said output buffer registers of said one station.

5. A simulation system for performing simulation of a plant controller of a plant, comprising; a data bus constituting a data path for transmitting signals, plural stations inserted in said data path, a plant controller, a simulator and an input/output device each being connected to a respective station, said stations including input/output buffer memories, said plant controller being connected to said data path through one of the said stations, and the output signal from the plant controller being transmitted via the output buffer memory of said one station, the data path and the input buffer memory of another of said stations, said simulator supplying a simulating signal to the said plant controller through the output buffer memory of its respective station, the data path and the input buffer memory of said one station, and said one station including an input buffer register connected to said input buffer memory and an output buffer register connected to said output buffer memory, and OR circuit means for logically summing outputs of said input and output buffer registers to form an output signal to be delivered to said data bus.

* * * * *